United States Patent
Ohashi et al.

(10) Patent No.: US 9,914,609 B2
(45) Date of Patent: Mar. 13, 2018

(54) FEEDER

(71) Applicant: FUJI MACHINE MFG. CO., LTD., Chiryu (JP)

(72) Inventors: Hiroyasu Ohashi, Toyota (JP); Hiroki Murase, Nagoya (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 14/914,867

(22) PCT Filed: Aug. 26, 2013

(86) PCT No.: PCT/JP2013/072784
§ 371 (c)(1),
(2) Date: Feb. 26, 2016

(87) PCT Pub. No.: WO2015/029125
PCT Pub. Date: Mar. 5, 2015

(65) Prior Publication Data
US 2016/0219762 A1   Jul. 28, 2016

(51) Int. Cl.
*B65H 20/20* (2006.01)
*B65H 20/22* (2006.01)
*H05K 13/04* (2006.01)

(52) U.S. Cl.
CPC ......... *B65H 20/22* (2013.01); *H05K 13/0417* (2013.01)

(58) Field of Classification Search
CPC ......... B65H 20/20; B65H 20/22; H05K 13/02
See application file for complete search history.

(56) References Cited

U.S. PATENT DOCUMENTS 4,867,363 A * 9/1989 Wood ..................... B65H 20/20
226/76
7,430,948 B2 * 10/2008 De Marco ............. B65H 20/22
83/236
(Continued)

FOREIGN PATENT DOCUMENTS

JP    2005-539370 A    12/2005
JP    2008-277509 A    11/2008
(Continued)

OTHER PUBLICATIONS

International Search Report dated Oct. 22, 2013 in PCT/JP2013/072784 filed Aug. 26, 2013.

*Primary Examiner* — Michael C McCullough
(74) *Attorney, Agent, or Firm* — Oblon, McClelland, Maier & Neustadt, L.L.P.

(57) ABSTRACT

A non-splicing feeder provided with multiple sprockets in the conveyance direction. Provided are a second sprocket that is rotatably provided at a position adjacent to a supply position of a main body and on which is formed a second engaging protrusion, a third sprocket that is rotatably provided at a position adjacent to an insertion section of the main body and on which is formed a third engaging protrusion, and a rail, the upper surface of which forms a conveyance path of a carrier tape, which is provided above the second sprocket and third sprocket, wherein space is formed above the rail between the second sprocket and third sprocket, and in a case in which engaging protrusions of both the third sprocket and second sprocket have engaged with engaging holes of a carrier tape, the carrier tape is slackened such that the carrier tape separates from the rail into space.

6 Claims, 14 Drawing Sheets

(56) References Cited

U.S. PATENT DOCUMENTS

| | | | | |
|---|---|---|---|---|
| 7,866,518 B2 * | 1/2011 | Wada | ..................... | B65H 20/20 226/128 |
| 2003/0219330 A1 | 11/2003 | Lyndaker et al. | | |
| 2011/0072654 A1 * | 3/2011 | Oyama | .............. | H05K 13/0417 29/832 |
| 2011/0243695 A1 | 10/2011 | Hwang et al. | | |

FOREIGN PATENT DOCUMENTS

| | | |
|---|---|---|
| JP | 2011-77096 A | 4/2011 |
| JP | 2011-181816 A | 9/2011 |
| JP | 2011-211169 A | 10/2011 |
| WO | 03/101172 A1 | 12/2003 |

\* cited by examiner

A-A cross section

C-C cross section

FEEDER

TECHNICAL FIELD

The present application relates to a feeder for supplying carrier tape in which components are stored.

BACKGROUND ART

As disclosed in PTL 1, non-splicing feeders which supply components stored in carrier tape to a component mounter without the need to perform splicing work have been proposed. With these kinds of feeders, a sprocket which engages with engaging holes formed in the carrier tape is provided, and the carrier tape is indexed by rotating this sprocket. With the non-splicing feeder disclosed in PTL 1, an insertion sprocket is provided near the insertion gate, and a pushing sprocket is provided near the supply position.

CITATION LIST

Patent Literature

PTL 1: JP-A-2011-77096

SUMMARY

Problem to be Solved

In the non-splicing feeder disclosed in patent literature 1, multiple sprockets are provided in the conveyance direction. The pitch between engagement holes formed in carrier tape is not necessarily at a uniform interval. Therefore, in a case in which the distance between the engaging holes which engage with the multiple sprockets provided in the conveyance direction is shorter than a specified distance, there is a problem in that the carrier tape is pulled by a sprocket which is provided upstream in the conveyance direction, thus there are cases in which components stored in the carrier tape are not supplied accurately to the supply position.

The present application takes account of the above issue, and an object thereof is to provide a non-splicing feeder provided with multiple sprockets in the conveyance direction that accurately supplies components stored in carrier tape to a supply position.

Means for Solving the Problem

In order to solve the above problem, according to one aspect of the disclosure, a feeder for inserting carrier tape, in which many components are successively stored in a conveyance direction and in which engaging holes which have a prescribed relationship with the components are formed at a regular hole pitch in the conveyance direction, into an insertion section, and feeding the carrier tape such that the components are sequentially supplied to a supply position on a side opposite to the insertion section, the feeder comprising: a main body; a downstream sprocket that is rotatably provided at a position adjacent to the supply position of the main body, and has an engaging protrusion that engages with the engaging holes formed on an outer circumference section thereof; an upstream sprocket that is rotatably provided at a position adjacent to the insertion section of the main body, and has an engaging protrusion that engages with the engaging holes formed on an outer circumference section thereof; and a rail, the upper surface of which forms a conveyance path of the carrier tape, that is provided above the downstream sprocket and the upstream sprocket along the conveyance direction; wherein a space is formed above the rail which is between the downstream sprocket and the upstream sprocket; and wherein, in a case in which engaging protrusions of both the upstream sprocket and the downstream sprocket are respectively engaged with the engaging holes of the carrier tape, the carrier tape slackens into the space so as to separate from the rail.

In this way, the configuration is such that, in a case in which the engaging protrusions of both the downstream sprocket and the upstream sprocket are respectively engaged with the engaging holes of the carrier tape, the carrier tape slackens so as to separate from the rail into the space. Due to this, even in a case in which the distance between the engagement holes which engage with the engaging protrusions of the downstream sprocket and the engaging protrusions of the upstream sprocket is shorter than a specified distance, carrier tape the engaging holes of which are engaged with the engaging protrusions of the downstream sprocket is not pulled by the upstream sprocket. Thus, components stored in the carrier tape are supplied accurately to the supply position.

According to another aspect of the disclosure, the distance between a rotation axis of the downstream sprocket and a rotation axis of the upstream sprocket is set to be shorter than a specified distance which is a multiple of the hole pitch. By this, in a case in which the engaging protrusions of both the downstream sprocket and the upstream sprocket are respectively engaged with the engaging holes of the carrier tape, the carrier tape slackens so as to reliably separate from the rail into the space.

According to yet another aspect of the disclosure, a raising prevention member that prevents a leading end of the carrier tape from raising up from the rail is provided in the space which is formed above the rail. By this, thanks to the raising prevention member, the leading end of the carrier tape is guided onto the downstream sprocket without raising up, and thus reliably engages with the engaging protrusions of the downstream sprocket.

According to yet another aspect of the disclosure, included is a rotation drive section that rotates the upstream sprocket and the downstream sprocket, a leading end detecting section that detects a leading end of the carrier tape upstream of the downstream sprocket, and an engaging control section that controls the rotation drive section such that, when the leading end detecting section detects the leading end of the carrier tape, the engaging protrusion of the downstream sprocket engages with the engaging hole formed in the leading end of the carrier tape.

By this, even in a case in which the distance between a rotation axis of the downstream sprocket and a rotation axis of the upstream sprocket is set to be shorter than a specified distance, the engaging protrusion of the downstream sprocket reliably engages with the engaging hole formed in the leading end of the carrier tape.

According to yet another aspect of the disclosure, the engaging control section, when engagement occurs between the engaging holes formed in the leading end of the carrier tape and the engaging protrusion of the downstream sprocket, controls the rotation drive section such that the timing to start rotation of the downstream sprocket and the timing to start rotation of the upstream sprocket are not synchronized.

By this, the engaging protrusion of the downstream sprocket is reliably engaged with the engaging hole formed in the leading end of the carrier tape by an easy method.

According to yet another aspect of the disclosure, in the conveyance direction, a tooth thickness dimension of the engaging protrusion of the downstream sprocket is set to be smaller than a tooth thickness dimension of the engaging protrusion of the upstream sprocket. Due to this, because the engaging protrusion of the downstream sprocket enters easily into the engaging hole, the engagement of the engaging protrusion of the downstream sprocket with the engagement hole formed in the leading end of the carrier tape is reliable.

DESCRIPTION OF EMBODIMENTS (Component Mounting Device)

Figure 1:
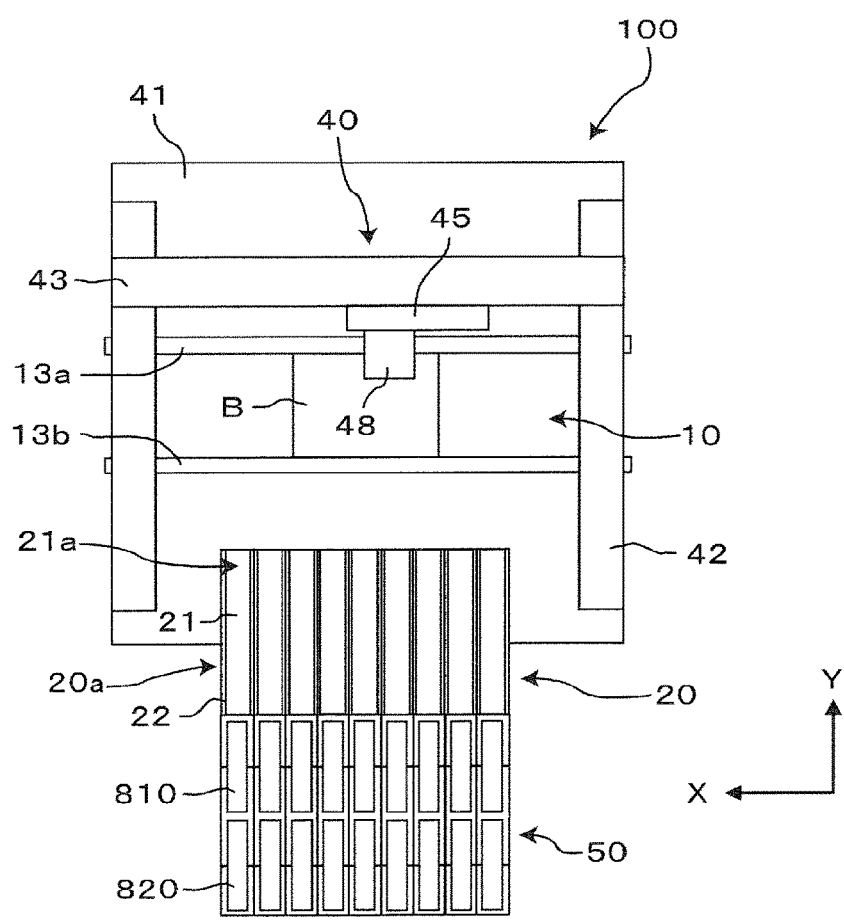
FIG. 1 is a conceptual view of a component mounting device from above.

Hereinafter, description will be given of component mounting device 100 which uses feeders 21 of the present embodiment using FIG. 1. Note that, in the description, a conveyance direction of a printed circuit board will be referred to as an X-axis direction, a direction perpendicular to the X-axis direction in a horizontal plane will be referred to as a Y-axis direction, and a direction which is perpendicular to the X-axis direction and the Y-axis direction will be referred to as a Z-axis direction. Component mounting device 100 includes board conveyance device 10, component supply section 20, component mounting device 40, and reel holding section 50.

Component supply section 20 is configured from multiple slots 20a, and multiple feeders 21 which are detachably mounted on each slot 20a. Slots 20a are provided in component supply section 20 lined up in parallel in the X-axis direction.

Reel holding section 50 holds, in an exchangeable manner, first reel 810 and second reel 820 on which carrier tapes 900 are wound. First reel 810 and second reel 820 are arranged adjacent to each other in the Y direction, and multiple of the reels are arranged in the X direction corresponding to each of the feeders 21.

Figure 2:
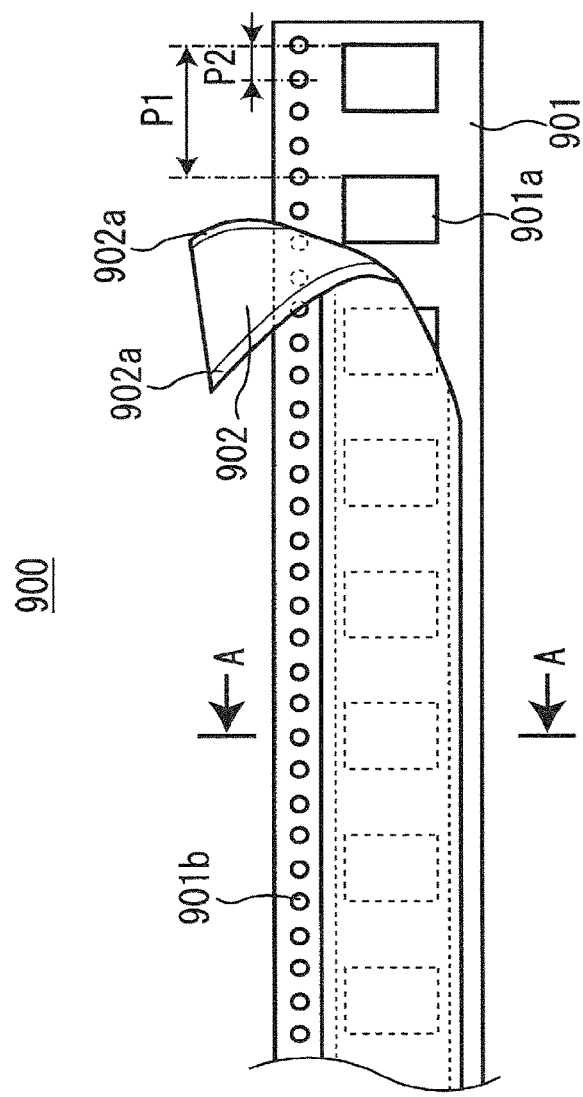
FIG. 2 is a top view of a carrier tape.
Figure 3:
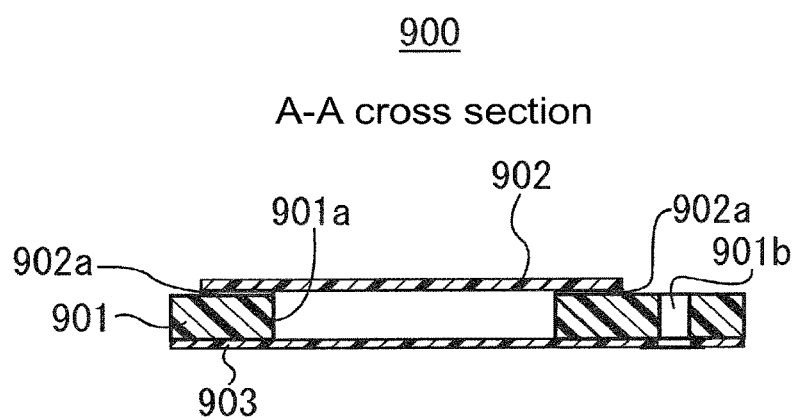
FIG. 3 is an A-A sectional diagram of the carrier tape illustrated in FIG. 2.

Carrier tape 900 stores many components such as electronic components or the like consecutively in the conveyance direction of carrier tape 900. As shown in FIG. 2 and FIG. 3, carrier tape 900 is formed of base tape 901, cover tape 902, and bottom tape 903. Base tape 901 is formed of a flexible material such as a paper material or a resin. Storage sections 901a, which are cavities, are formed as through-holes in a center portion of base tape 901 in the width direction at a fixed pitch P1 (hereinafter referred to as component pitch P1) in the length direction. Components are stored in storage sections 901a. Engagement holes 901b are formed as through-holes in a side portion of the base tape 901 at a fixed pitch P2 (hereafter referred to hole pitch P2) in the length direction. Note that, there is a relationship between the position in which engagement holes 901b are formed, and the position in which storage sections 901a are formed. In the present embodiment, component pitch P1 is four times the length of hole pitch P2.

Both side portions of cover tape 902 are adhered to both side portions of the top surface of base tape 901 using an adhesive 902a. Cover tape 902 is formed of a transparent polymer film.

As illustrated in FIG. 3, bottom tape 903 is adhered to the bottom surface of base tape 901. Components which are stored in storage sections 901a are prevented from falling out by bottom tape 903. Bottom tape 903 is formed of a paper material, a polymer film or the like and is transparent or semi-transparent.

Carrier tape 900 which is wound on first reels 810 and second reels 820 is inserted into each of the corresponding feeders 21. Also, carrier tape 900 which is wound on one of the reels 810 is inserted from insertion section 21d provided on the rear end of feeder 21, and sequentially supplied to component supply position 21a, which is provided on a tip portion of feeder 21 (the opposite side to insertion section 21d), by feeder 21. In this way, components held in carrier tape 900 are supplied to supply position 21a. Also, carrier tape 900 which is wound on the other reel 820 is inserted into feeder 21, but this carrier tape 900 stands by without being supplied by feeder 21. Detailed description of feeder 21 will be given later.

As shown in FIG. 1, in board conveyance device 10, a pair of guide rails 13a and 13b are provided respectively on base 41 of component mounting device 40. Also, a pair of conveyor belts which support and convey a printed circuit board B which is guided by both of the guide rails 13a and 13b and which are omitted from the drawings are provided in board conveyance device 10. Also, a clamp device which holds up and clamps the printed circuit board B which is conveyed to a predetermined position and which is omitted from the drawings is provided in board conveyance device 10.

In this board conveyance device 10, printed circuit board B onto which components are to be mounted is conveyed in the X-axis direction to a component mounting position by the conveyor belts while being guided by guide rails 13a and 13b. Printed circuit board B which is conveyed to the component mounting position is positioned and clamped in the component mounting position by the clamp device.

Figure 11:
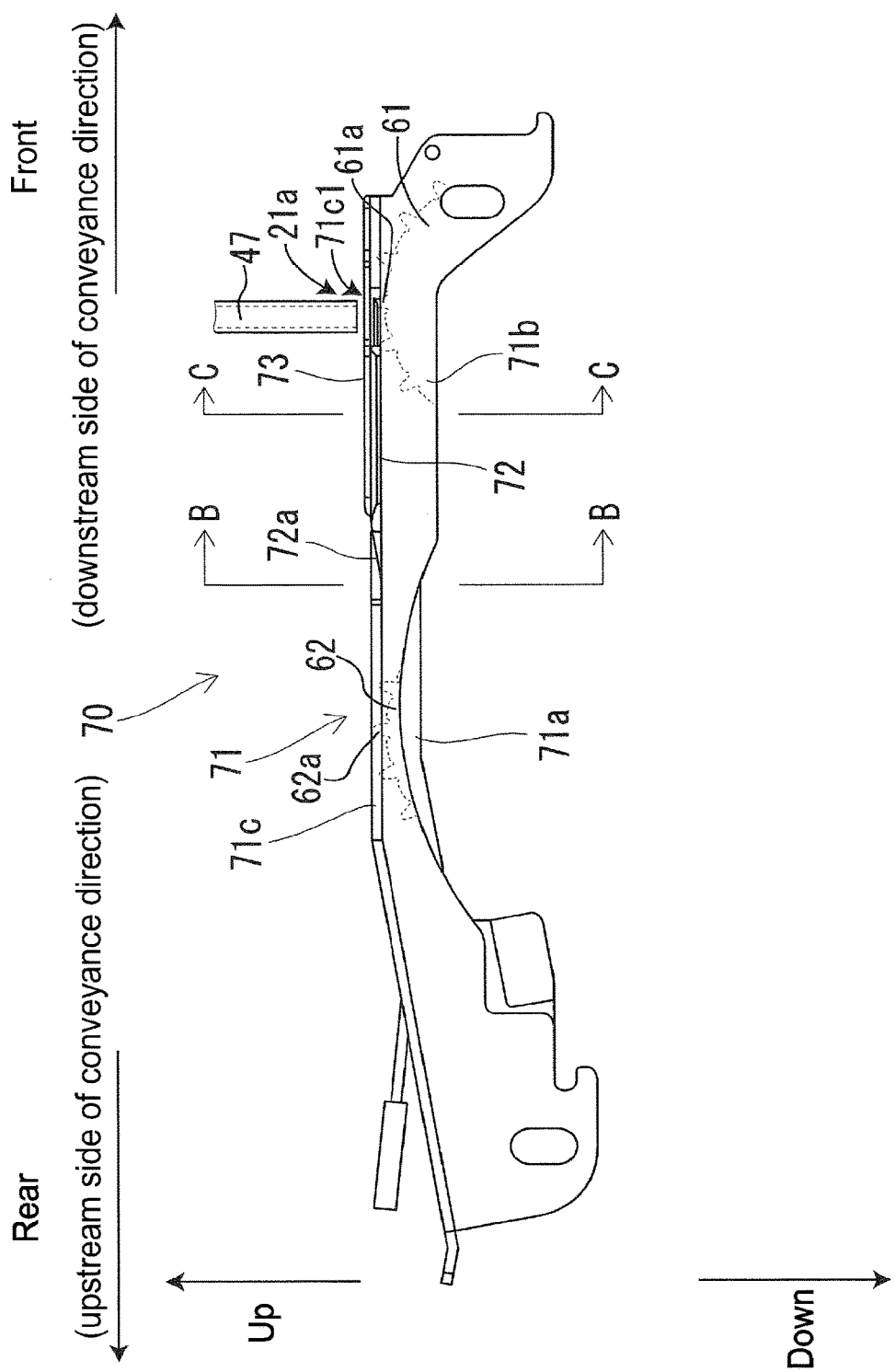
FIG. 11 is a side view of the tape peeling unit.
Figure 12:
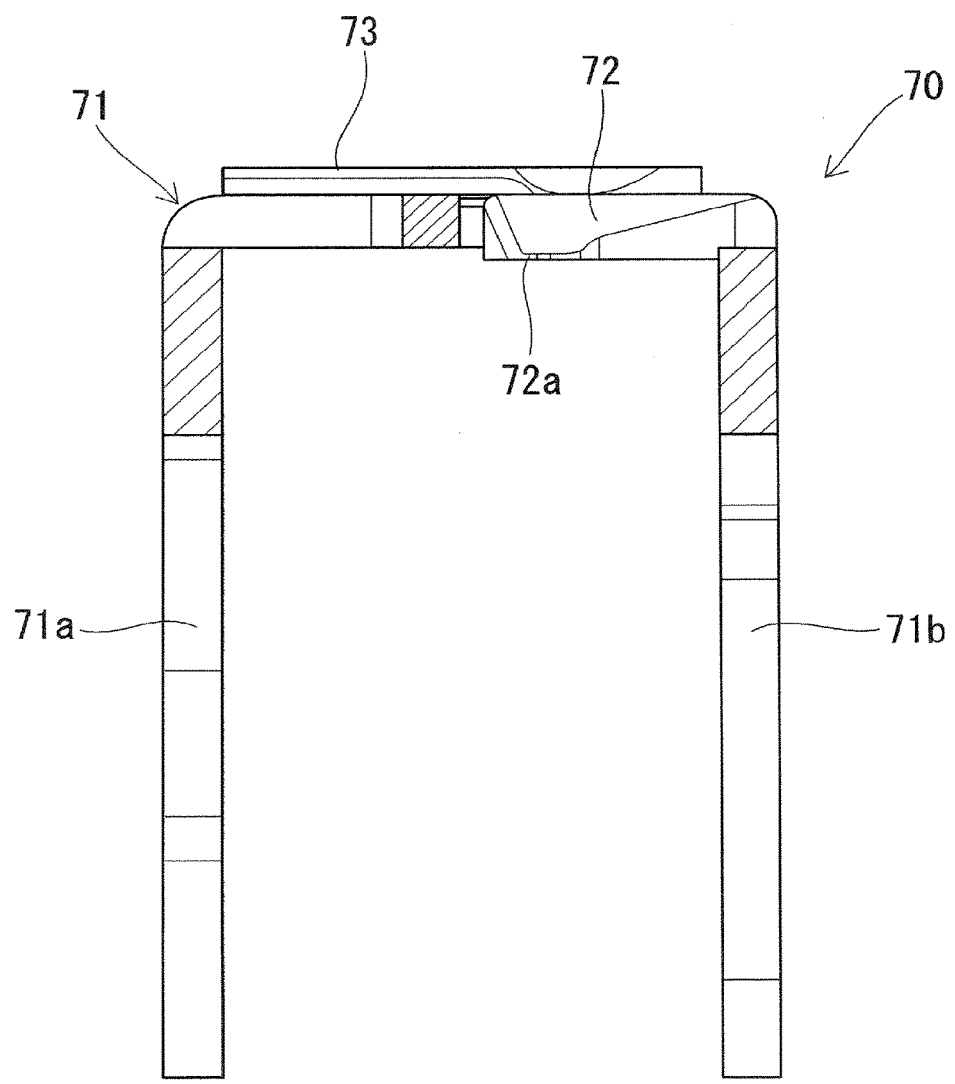
FIG. 12 is a cross-sectional diagram taken along the B-B line of FIG. 11.
Figure 13:
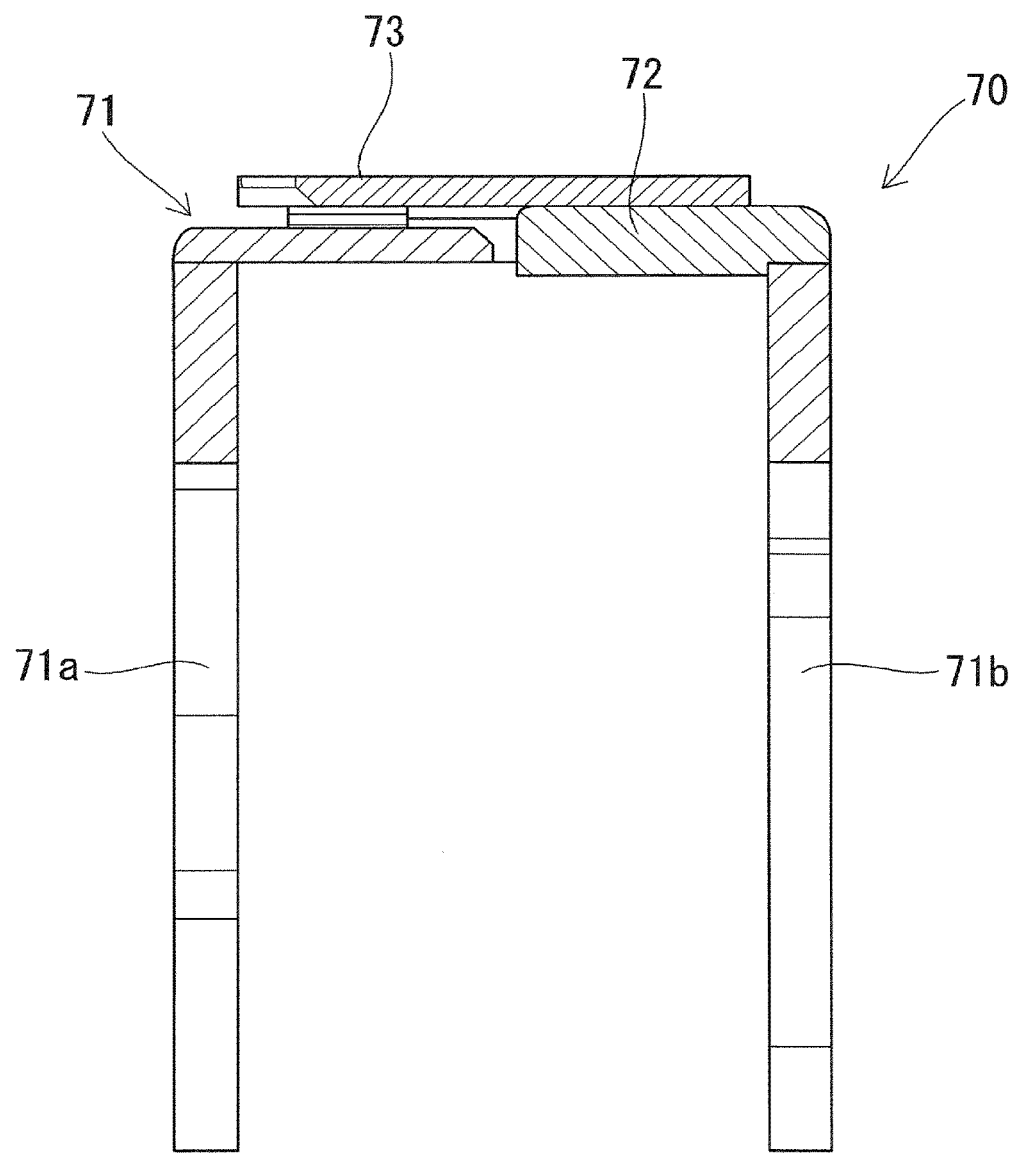
FIG. 13 is a cross-sectional diagram taken along the C-C line of FIG. 11.

As shown in FIG. 1, component mounting device 40 includes guide rail 42, Y-axis slide 43, a Y-axis servo motor (not shown), X-axis slide 45, an X-axis servo motor (not shown), component mounting head 48, and section nozzle 47 (shown in FIG. 11).

A Y robot is configured from guide rail 42, Y-axis slide 43, and the Y-axis servo motor. Guide rail 42 is mounted in the Y direction above the base 41 and is arranged to be above board conveyance device 10. Y-axis slide 43 is provided to be capable of moving in the Y-axis direction along guide rail 42. Y-axis slide 43 is moved in the Y-axis direction by a ball screw mechanism that has a ball screw connected to an output shaft of the Y-axis servo motor.

An X-axis robot is formed from X-axis slide 45 and the X-axis servo motor. X-axis slide 45 is provided to be capable of moving in the X-axis direction on Y-axis slide 43. The X-axis servo motor is provided on Y-axis slide 43. X-axis slide 45 is moved in the X-axis direction by a ball screw mechanism, which is not shown, connected to an output shaft of the X-axis servo motor.

Component mounting head 48 is provided on X-axis slide 45. Component mounting head 48 holds suction nozzle 47 (shown in FIG. 11) in a detachable manner. Suction nozzle 47 picks up a component which is supplied to component supply position 21a and mounts the component on the printed circuit board B which is positioned in the component mounting position by board conveyance device 10.

(Feeder)

Figure 4:
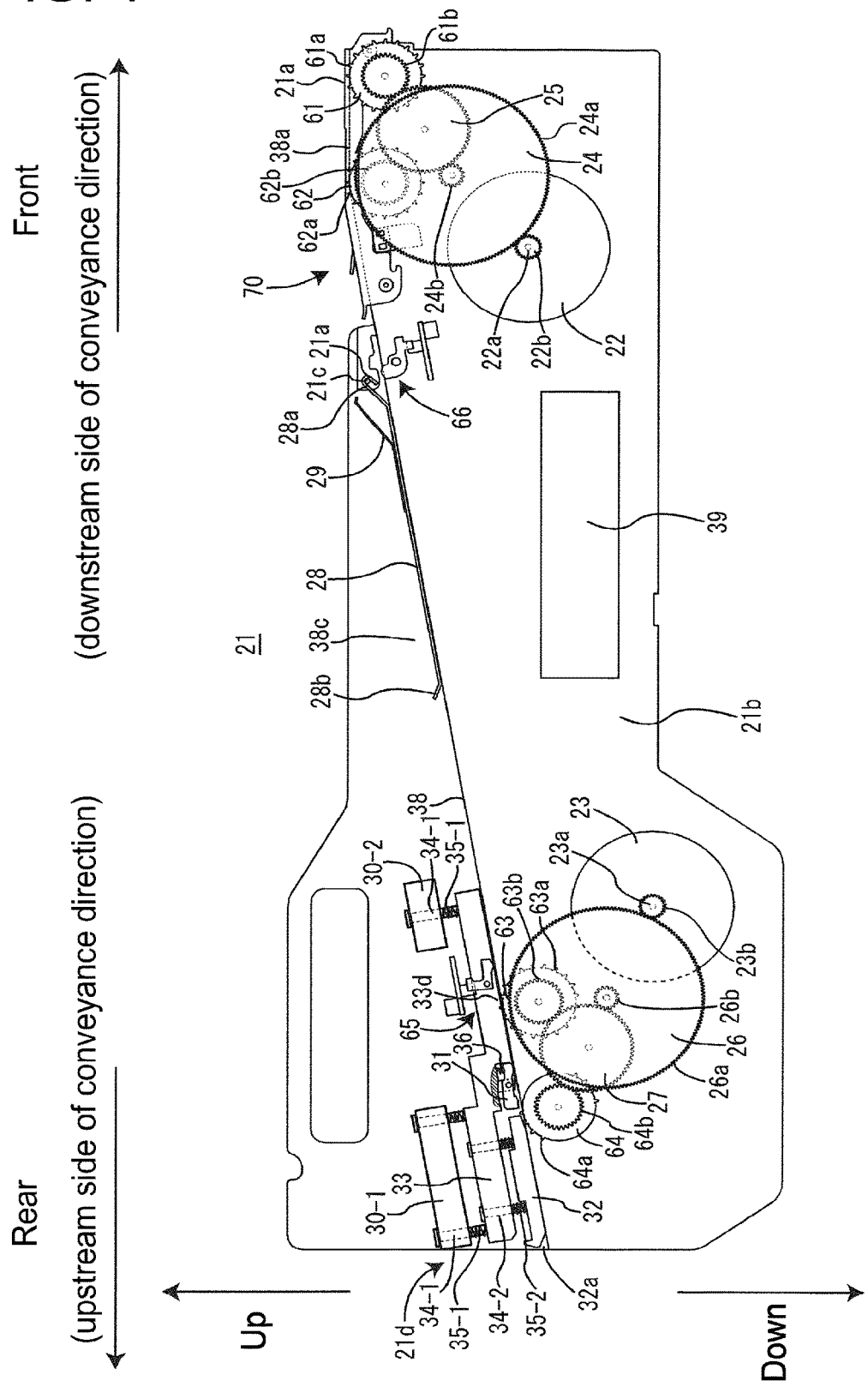
FIG. 4 is a cutaway side view of a feeder.
Figure 5:
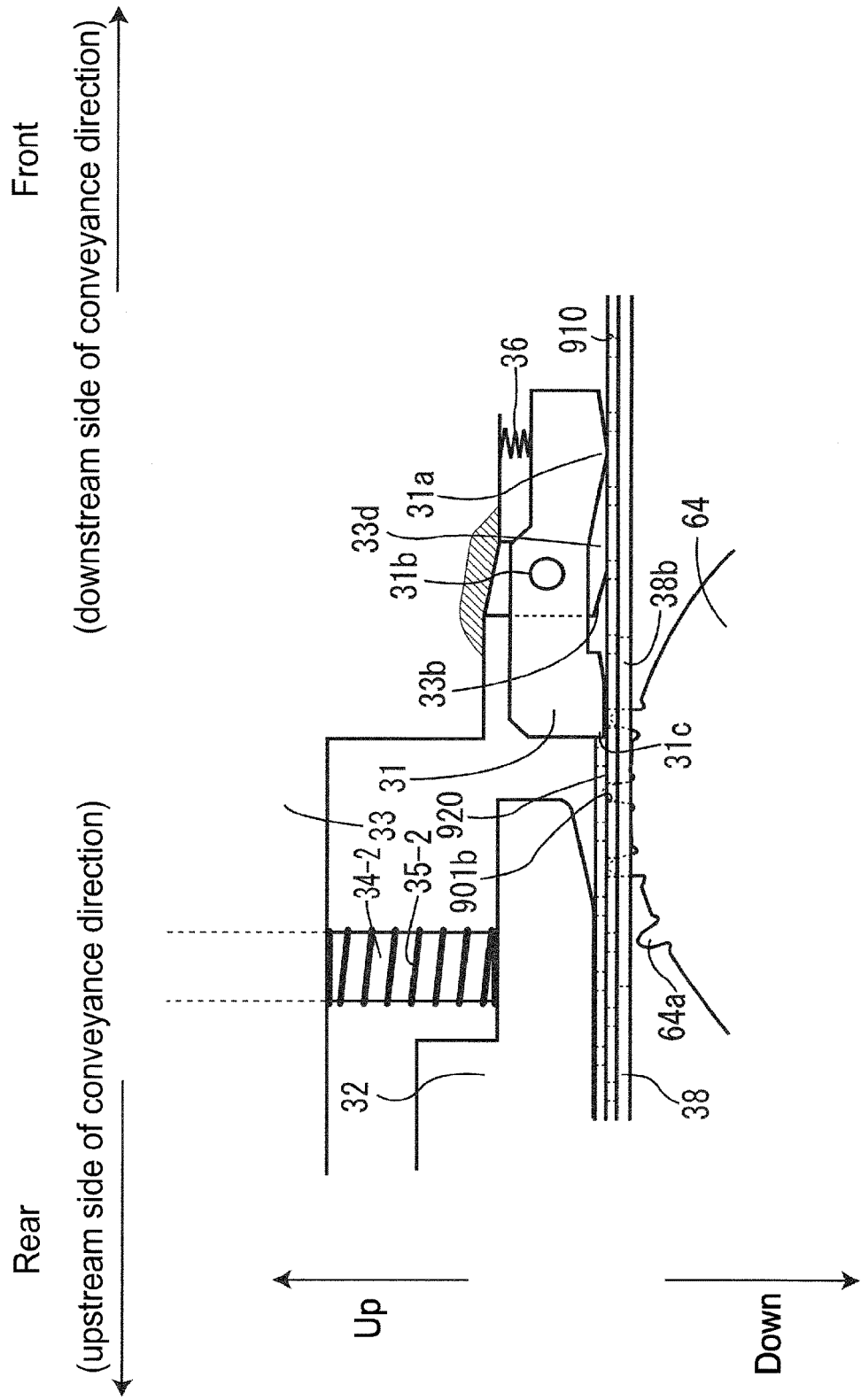
FIG. 5 is a cutaway side view representing an insertion section of the feeder.
Figure 6:
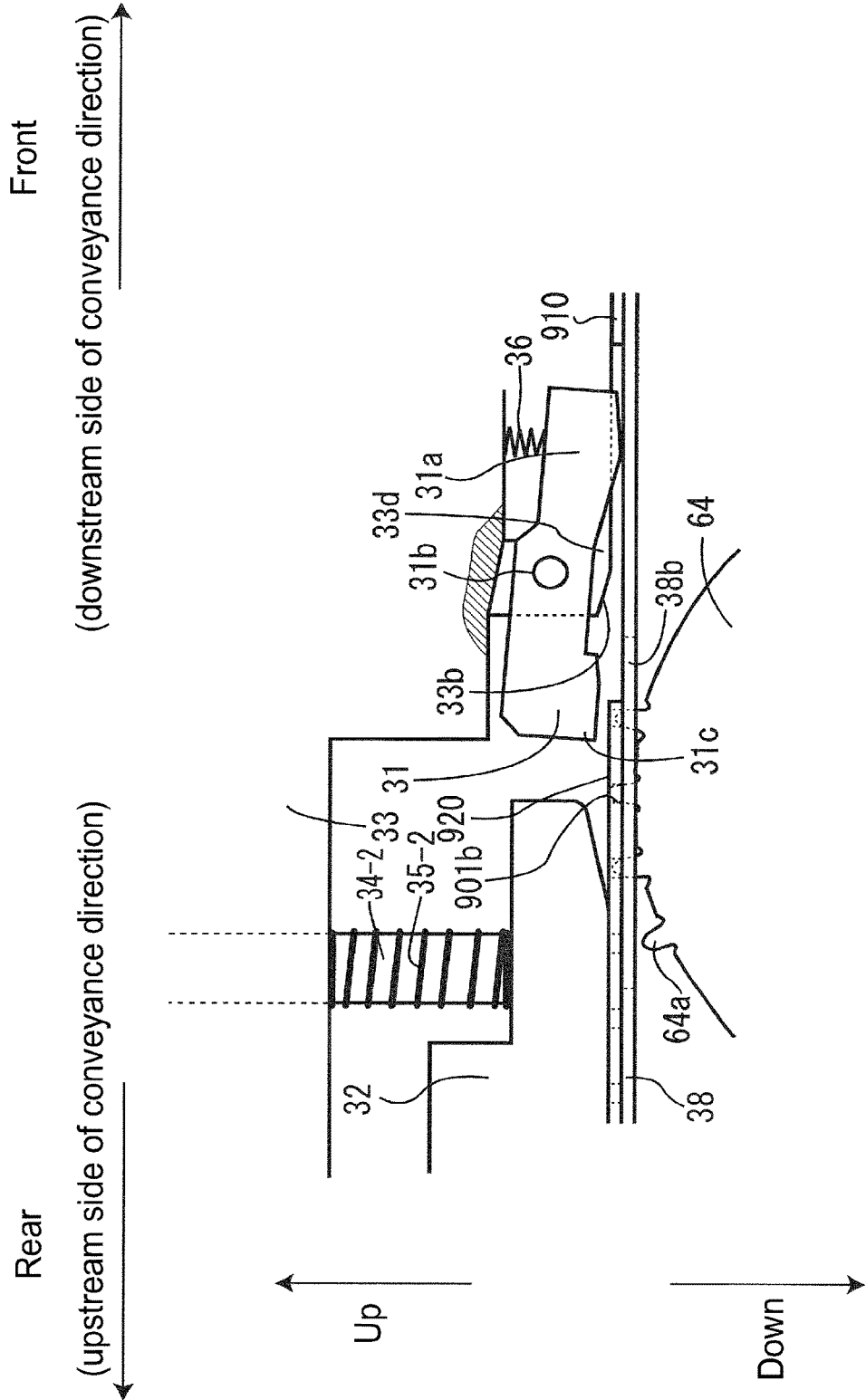
FIG. 6 is a cutaway side view representing an insertion section of the feeder.

Hereinafter, description will be given of feeder 21 of the present embodiment using FIGS. 4 to 8. Note that, in the description hereinafter, the term "conveyance direction" indicates the conveyance direction of carrier tape 900. In FIGS. 4 to 8, the right side of the paper surface is set to the front (the downstream side in the conveyance direction) and the left side of the paper surface is set to the rear (the upstream side in the conveyance direction). In FIGS. 4 to 6, upward on the paper surface is set to upward, and downward on the paper surface is set to downward.

Feeder 21 is formed mainly of main body 21b, first servo motor 22, second servo motor 23, first gear 24, second gear 25, third gear 26, fourth gear 27, lifting prevention member 28, torsion spring 29, stopper member 31, upstream side retaining member 32, downstream side retaining member 33, first sprocket 61, second sprocket 62, third sprocket 63, fourth sprocket 64, rail 38, control section 39, and tape peeling unit 70.

Feeder 21 is mounted by being inserted into slot 20a from the front. Main body 21b is a flat box shape. Note that, FIGS. 4 to 6 are diagrams with a side wall of main body 21b removed to show the internal structure of feeder 21.

Rail 38 is provided from insertion section 21d at the rear section of main body 21b to supply position 21a above fourth sprocket 54 to first sprocket 61 along the conveyance direction of the carrier tape. The top surface of rail 38 forms the conveying path of carrier tape 900. Front section 38a of rail 38 is formed horizontally. In the present embodiment, rail 38 is inclined to gradually increase in height from the rear section to before front section 38a. Note that, although not depicted in the drawings, guide members which are separated by a dimension which is slightly greater than the width dimension of carrier tape 900 are provided on both sides of rail 38.

Each of first sprocket 61 and second sprocket 62 is provided, to be capable of rotating, from the front toward the rear (from the downstream side to the upstream side in the conveyance direction) in main body 21b beneath front section 38a of rail 38, that is, in positions adjacent to the supply position 21a of main body 21b. Each of third sprocket 63 and fourth sprocket 64 is provided, to be capable of rotating, from the front toward the rear in main body 21b beneath the rear section of rail 38, that is at a position adjacent to insertion section 21d of main body 21b.

The distance between a rotation axis of second sprocket 62 and a rotation axis of third sprocket 63 (refer to FIG. 15) is set to be shorter than a specified distance which is a multiple of hole pitch P2. In the present embodiment, the distance between a rotation axis of second sprocket 62 and a rotation axis of third sprocket 63 is set to be shorter than one hole pitch P2.

First engaging protrusions 61a, second engaging protrusions 62a, and third engaging protrusions 63a are formed at a fixed angle on the outer circumferences of first sprocket 61, second sprocket 62, and third sprocket 63, respectively. Fourth engaging protrusions 64a are formed at a fixed angle on a portion of the outer circumference of fourth sprocket 64. Each of the engaging protrusions 61a to 64a engages with engagement holes 901b of carrier tape 900.

Note that, as shown in FIG. 7A and FIG. 7B, in the conveyance direction, tooth thickness dimension b of second engaging protrusion 62a is set to be smaller than tooth thickness dimension a of third engaging protrusion 63a, first engaging protrusion 61a, and fourth engaging protrusion 64a. Note that, in the present embodiment, as shown in FIG. 8, tooth width dimension c of third engaging protrusion 63a, first engaging protrusion 61a, and fourth engagement protrusion 64a is equal to tooth width dimension d of second engaging protrusion 62a. Note that, tooth width dimensions are dimensions of engaging protrusions 62a and 63a in a direction perpendicular to the tooth thickness dimensions.

As shown in FIG. 8B, when viewing third engaging protrusion 63a, first engaging protrusion 61a, and fourth engaging protrusion 64a from above, the four corners of first engaging protrusion 61a contact the inner surface of engaging hole 901b. Accordingly, components stored in carrier tape 900 are supplied by being accurately positioned at supply position 21a by first engaging protrusion 61a which is reliably engaged with engaging hole 901b. Conversely, as shown in FIG. 8A, when viewing second engaging protrusion 62a from above, there is clearance between second engaging protrusion 62a and the inner surface of engaging hole 901b.

First sprocket gear 61b, second sprocket gear 62b, third sprocket gear 63b, and fourth sprocket gear 64b are formed closer to the inside than the outer circumference of the first sprocket 61 to the fourth sprocket 64, respectively. Note that, window hole 38b (refer to FIGS. 5 and 15) is provided above each of the sprockets 61 to 64 of rail 38. Each of the engaging protrusions 61a to 64a protrudes from the top of rail 38 through window hole 38b.

First servo motor 22 is a servo motor which rotates the first sprocket 61 and the second sprocket 62. First drive gear 22b is provided on rotating shaft 22a of the first servo motor 22. First gear 24 is rotatably provided on main body 21b beneath first sprocket 61 and second sprocket 62. First outside gear 24a which meshes with first drive gear 22b is formed on the outer circumference of first gear 24. First inside gear 24b is formed closer to the inside than the outer circumference of first gear 24.

Second gear 25 is rotatably provided on main body 21b between first sprocket 61 and second sprocket 62, and first gear 24. Second gear 25 meshes with first sprocket gear 61b, second sprocket gear 62b, and first inside gear 24b. According to this configuration, the rotation speed of first servo motor 22 is reduced and transmitted to first sprocket 61 and second sprocket 62, and, first sprocket 61 and second sprocket 62 rotate in synchronization.

Second servo motor 23 is a servo motor which rotates third sprocket 63 and fourth sprocket 64. Second drive gear 23b is provided on rotating shaft 23a of second servo motor 23. Third gear 26 is rotatably provided on main body 21b beneath third sprocket 63 and fourth sprocket 64. Third outside gear 26a which meshes with second drive gear 23b is formed on the outer circumference of third gear 26. Third inside gear 26b is formed closer to the inside than the outer circumference of third gear 26.

Fourth gear 27 is rotatably provided on main body 21b between third sprocket 63 and fourth sprocket 64, and third gear 26. Fourth gear 27 meshes with third sprocket gear 63b, fourth sprocket gear 64b, and third inside gear 26b. According to this configuration, the rotation speed of second servo motor 23 is reduced and transmitted to third sprocket 63 and fourth sprocket 64, and, third sprocket 63 and fourth sprocket 64 rotate in synchronization.

Downstream side retaining member 33 is block-shaped and is provided on insertion section 21d of main body 21b above the rear section of rail 38. Downstream side retaining member 33 is attached to first support member 30-1 and second support member 30-2, which are attached to main body 21b, via shaft 34-1 so as to be capable of moving in the vertical direction. Coil spring 35-1 which biases downstream side retaining member 33 downward is attached to shaft 34-1. Retaining section 33d which abuts rail 38 on third sprocket 63 is formed in front of the downstream side retaining member 33. According to this configuration, retaining section 33d moves toward and away from the rail 38. As illustrated in FIG. 5, penetrating section 33b is formed as a cutout on the bottom portion of the rear end of retaining section 33d.

Upstream side retaining member 32 is block-shaped and is provided along the top surface of the rear section of rail 38. Upstream side retaining member 32 is attached beneath the rear section of downstream side retaining member 33 via shaft 34-2 to be capable of moving in the vertical direction. Upstream side retaining member 32 is adjacent to the rear of retaining section 33d. Coil spring 35-2 which biases upstream side retaining member 32 downward is attached to shaft 34-2. According to this configuration, upstream side retaining member 32 moves toward and away from rail 38. Insertion recessed section 32a is formed as a cutout on the bottom portion of the rear end of upstream side retaining member 32.

As illustrated in FIG. 5, stopper member 31 is block-shaped and is provided adjacent on the downstream side of upstream side retaining member 32. Stopper member 31 is capable of rocking due to shaft support section 31b which is formed in a middle portion of stopper member 31 being axially supported by downstream side retaining member 33. Abutting section 31a which is formed to protrude downward is formed on the bottom portion of stopper member 31 which is closer to the front than the shaft support portion 31b. The rear end of the bottom section of stopper member 31 is stopping section 31c.

Spring 36 which biases stopper member 31 in a direction in which abutting section 31a approaches rail 38 is attached to downstream side retaining member 33. As illustrated in FIG. 5, in relation to the conveyance direction, the apex section of fourth sprocket 64 is positioned between the front end of downstream side retaining member 33 and the rear end of stopper member 31.

As illustrated in FIG. 4, lifting prevention member 28 is plate-shaped and is provided along the top of rail 38 between the third sprocket 63 and the second sprocket 62. Shaft support portion 28a is formed on the front end of lifting prevention member 28, and shaft support portion 28a is axially supported on shaft portion 21c which is provided in main body 21b, and, lifting prevention member 28 is attached to main body 21b to be capable of rocking. Guide section 28b which is bent upward is formed on the rear end of lifting prevention member 28. Torsion spring 29 is attached to main body 21b above lifting prevention member 28 and biases lifting prevention member 28 downward. The bottom surface of lifting prevention member 28 comes into close contact with the top surface of rail 38 due to torsion spring 29.

Note that, space 38c is formed above rail 38 between second sprocket 62 and third sprocket 63.

Control section 39 controls feeder 21 and controls the rotation of first servo motor 22 and second servo motor 23. Control section 39 includes a microprocessor and a driver which supplies the drive currents to servo motors 22 and 23.

First sensor 65 which detects the presence or absence of carrier tape 900 and outputs that detection signal to control section 39 is provided in main body 21b on the downstream side of third sprocket 63. First sensor 65 is a sensor which detects a boundary portion between conveyance tape 910 and standby tape 920 which are described later. Second sensor 66 which detects the presence or absence of carrier tape 900 and outputs that detection signal to control section 39 is provided in main body 21b on the upstream side of second sprocket 62. Description will be given of the role of second sensor 66 later.

(Tape Peeling Unit)

Figure 9:
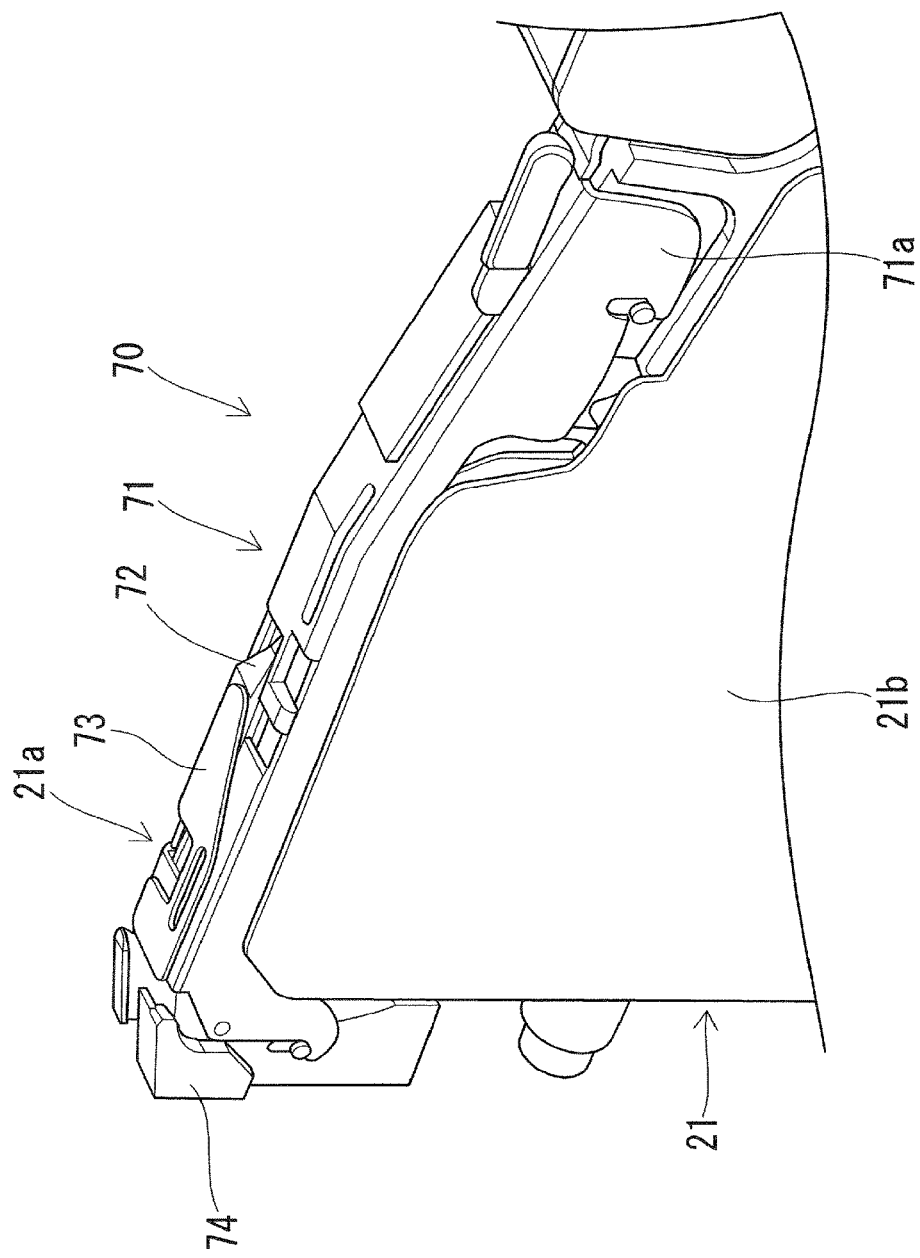
FIG. 9 is a perspective view of a non-splicing feeder with a tape peeling unit attached.

Next, tape peeling unit 70 of the present embodiment will be described using FIGS. 9 to 14. As shown in FIGS. 4 and 9, at the upper section of the front section of feeder 21, tape peeling unit 70 is detachably provided on main body 21b of feeder 21. Tape peeling unit 70 is for peeling cover tape 902 of carrier tape 900 which has been fed to supply position 21a.

Figure 10:
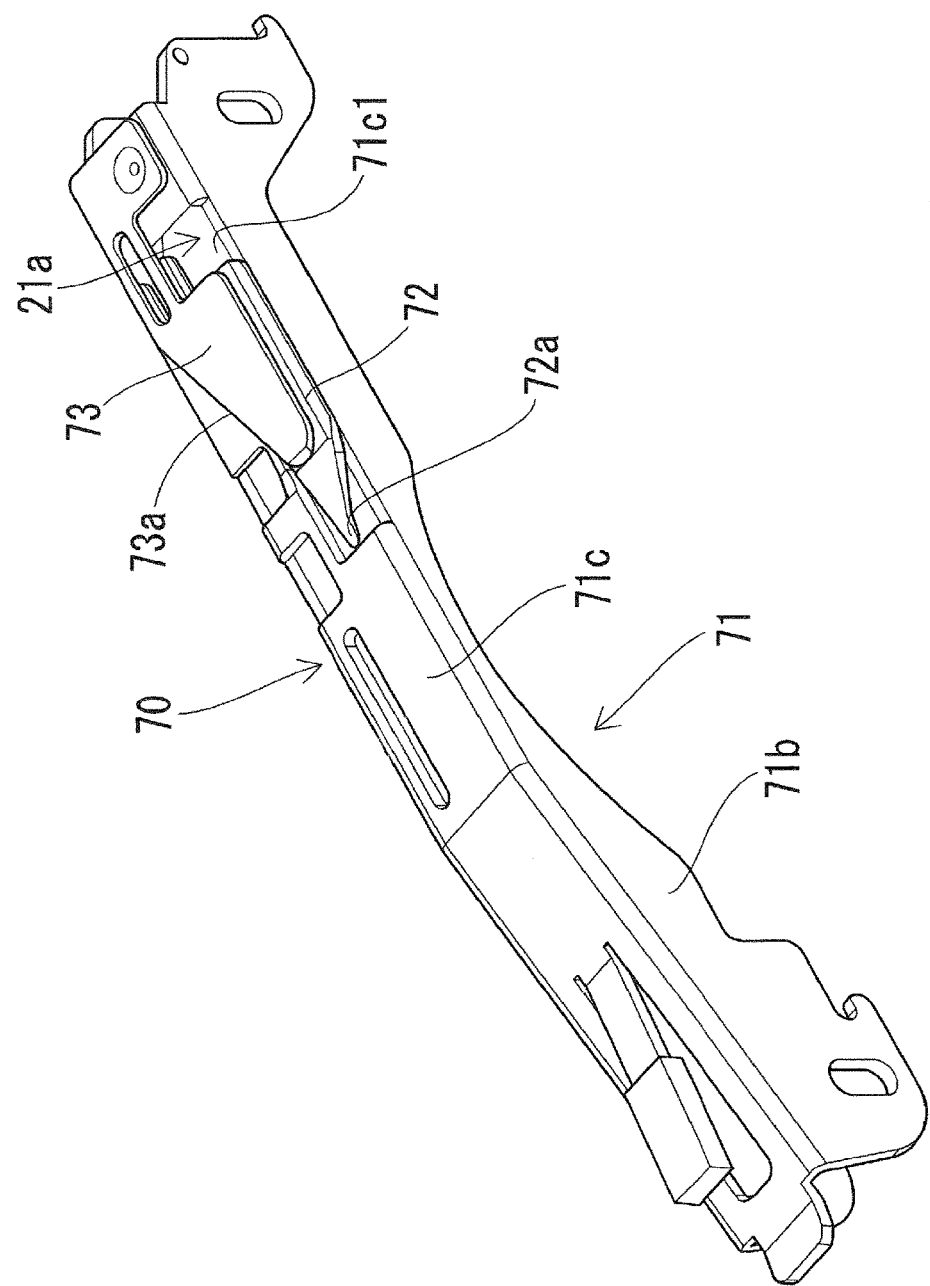
FIG. 10 is a perspective view showing the tape peeling unit in detail.

As shown in FIGS. 9 to 13, tape peeling unit 70 has box-shaped unit main body 71 the bottom side of which is open. The front and rear of both side walls 71a and 71b of unit main body 71 are fixed to both side surfaces of feeder main body 21b using a fastening means such as a screw. Carrier tape 900 is guided between both of the side walls 71a and 71b. As shown in FIG. 10, cutout 71c1 is formed in the front section of upper wall 71c of unit main body 71. As shown in FIG. 11, the front section of cutout 71c1 is supply position 21a, and a component stored in storage section 901a of carrier tape 900 is picked up and removed by suction nozzle 47 from this cutout 71c1.

As shown in FIG. 11, first sprocket 61 is provided on main body 21b at supply position 21a (cutout 71c1) at the downstream side in the conveyance direction. That is, first engaging protrusion 61a positioned at the apex section of first sprocket 61 is positioned at the downstream side in the conveyance direction of cutout 71c1 (supply position 21a).

As shown in FIGS. 9 and 10, plated shaped cutter member 72 is fixed to upper wall 71c of unit main body 71 in a position above rail 38 (carrier tape 900) so as to cover cutout 71c1. Cutting edge 72a with a sharp tip that peels cover tape 902 of carrier tape 900 is provided at the rear of cutter member 72.

As shown in FIG. 11, second sprocket 62 is provided at the downstream side in the conveyance direction of cutting edge 72a of cutter member 72. That is, second engaging protrusion 62a positioned at the apex section of second sprocket 62 is positioned at the downstream side of the conveyance direction of cutting edge 72a of cutter member 72.

Both edges of cover tape 902 are adhered to the carrier tape 900 and cutting edge 72a of cutter member 72 is provided in a position corresponding to one edge (the edge at the engagement hole 901b side) of cover tape 902. Cutting edge 72a of cutter member 72 is interposed between base tape 901 and cover tape 902 as carrier tape 900 is fed so as to peel one edge of cover tape 902 while maintaining the adhered state of the other edge of cover tape 902.

Note that, when engaging hole 901b of carrier tape 900 is engaged with first engaging protrusion 61a, carrier tape 900 is pulled by first sprocket 61, and an edge section of cover tape 902 is peeled by cutting edge 72a of cutter member 72. On the other hand, when preceding carrier tape 900 has been fully fed to feeder 21 and an engaging hole 901b formed in the leading end of new carrier tape 900 is engaged only with second engaging protrusion 62a, carrier tape 900 is pushed onto cutter member 72 by second sprocket 62 and an edge section of cover tape 902 is peeled by cutting edge 72a of cutter member 72.

As shown in FIG. 10, plate-shaped fold-over member 73 is provided on upper wall 71c of unit main body 71 such that a small gap is formed between fold-over member 73 and the top surface of carrier tape 900. Fold-over member 73 erects and folds over one of the edges of peeled cover tape 902. Inclined surface 73a which is inclined in the width direction of cover tape 902 is formed on fold-over member 73 across a predetermined length along the feeding direction of carrier tape 900. Inclined surface 73a of fold-over member 73 protrudes in the width direction of cover tape 902 in relation to cutter member 72.

Figure 14:
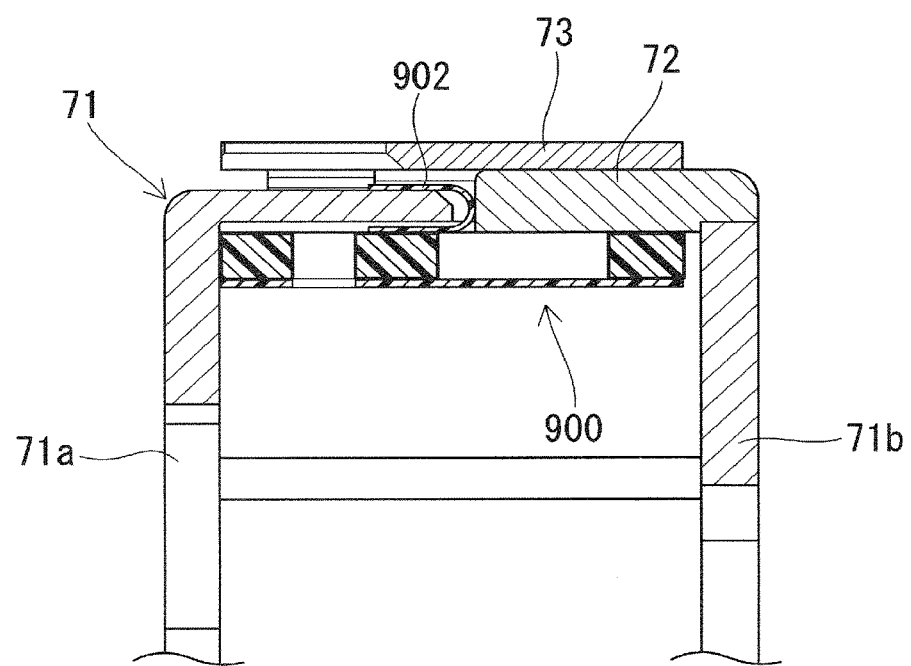
FIG. 14 is a diagram illustrating a state in which cover tape is folded over by the tape peeling unit.

Fold-over member 73 folds over the one of edges of cover tape 902 which is peeled by cutting edge 72a of cutter member 72 such that the edge of cover tape 902 is gradually erected by inclined surface 73a, thus opening (exposing) the top surface of storage section 901a in which the component which is supplied to the component supply position 21a is stored. As illustrated in FIG. 14, cover tape 902 which is folded over by inclined surface 73a of fold-over member 73 is forcefully inserted into the gap between fold-over member 73 and the top surface of carrier tape 900 (base tape 901) such that the open state of the top surface of storage section 901a is maintained.

By adopting this configuration, as with conventional art, individual collection mechanisms which fold over and collect cover tape 902 become unnecessary, and cover tape 902 becomes capable of being collected together with base tape 901 of carrier tape 900. Note that, 74 in FIG. 9 is a guide for collecting cover tape 902 and carrier tape 900, and is fixed to the tip portion of main body 21b.

(Feeder Operation)

Hereinafter, description will be given of operations of feeder 21. A worker inserts carrier tape 900 between the insertion recessed section 32a and the rear end of rail 38 which are illustrated in FIG. 4. When this is done, fourth engaging protrusions 64a engage with engagement holes 901b which are formed in the leading end of the inserted carrier tape 900, and the carrier tape 900 is conveyed to third sprocket 63 by fourth sprocket 64. Since fourth engaging protrusions 64a are only formed in a portion of the outer circumference of fourth sprocket 64, when fourth engaging protrusions 64a engage with engagement holes 901b which are formed in the leading end of the inserted carrier tape 900, carrier tape 900 moves to the third sprocket 63 side intermittently. Therefore, since carrier tape 900 is not suddenly pulled to the third sprocket 63 side, this is safe.

The leading end of carrier tape 900 which is supplied to the downstream side by fourth sprocket 64 enters below retaining section 33d from penetrating section 33b. When engagement holes 901b which are formed in the leading portion of carrier tape 900 are engaged with third engaging protrusions 63a, carrier tape 900 is conveyed to second sprocket 62 by third sprocket 63. Since third engaging protrusions 63a are formed along the entire circumference of the outer circumference of third sprocket 63, carrier tape 900 is conveyed to second sprocket 62 side in a short time. Note that, conveyance tape 910 is pushed from above by retaining section 33d and the engagement between the engagement holes 901b and third engaging protrusions 36a is not released.

The leading end of carrier tape 900 enters beneath lifting prevention member 28 from between guide section 28b and rail 38. The leading end of carrier tape 900 is suppressed from lifting up from rail 38 by lifting prevention member 28 and is conveyed to second sprocket 62.

When second sensor 66 detects the leading end of carrier tape 900 which is conveyed thereto by third sprocket 63, control section 39 intermittently rotates sprockets 61 to 64 by component pitch P1 (illustrated in FIG. 2) by intermittently rotating first servo motor 22 and second servo motor 23. Here, control section 39 starts the rotation of first servo motor 22 earlier than the rotation of second servo motor 23 such that engaging hole 901b formed in the leading end of carrier tape 900 engages with second engaging protrusion 62a. By doing this, even when the distance between a rotation axis of second sprocket 62 and a rotation axis of third sprocket 63 is set to be shorter than a specified distance which is a multiple of hole pitch P2, by starting the rotation of second sprocket 62 earlier than the rotation of third sprocket 63, engaging hole 901b formed in the leading end of carrier tape 900 engages with second engaging protrusion 62a.

Figure 15:
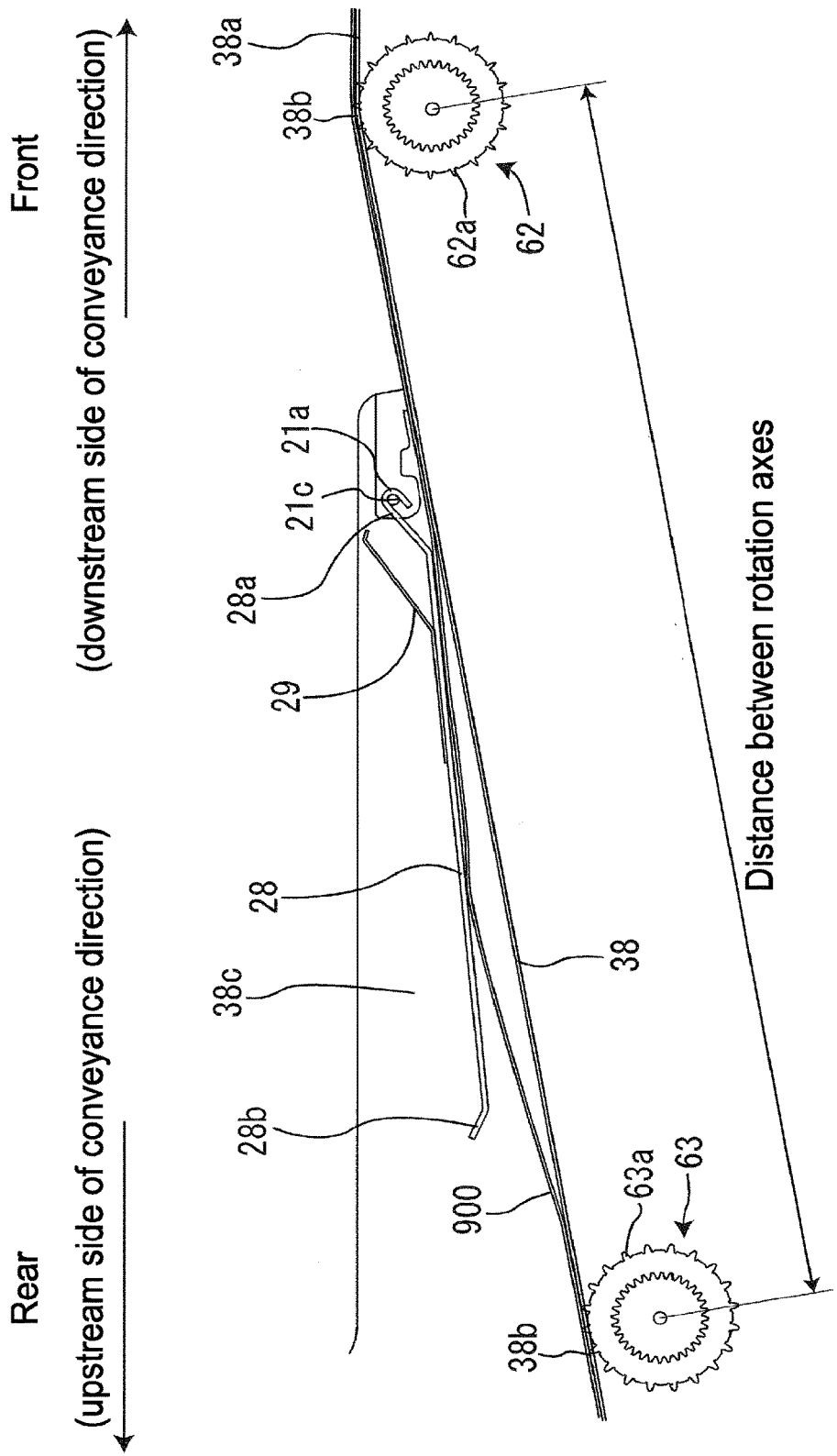
FIG. 15 shows the carrier tape in a state separated from the rail and in the space above the rail.

Next, control section 39 starts rotation of first servo motor 22 and second servo motor 23 at the same time at the time when engaging hole 901b formed in the leading end of carrier tape 900 has engaged with second engaging protrusion 62a, and intermittently rotates first servo motor 22 and second servo motor 23, thus rotating third sprocket 63 and second sprocket 62 intermittently in the same phase. As given above, because the distance between a rotation axis of second sprocket 62 and a rotation axis of third sprocket 63 is set to be shorter than a specified distance which is a multiple of hole pitch P2, as shown in FIG. 15, carrier tape 900 between third sprocket 23 and second sprocket 62 slackens upwards such that carrier tape 900 separates upwards from rail 38 in the section between third sprocket 23 and second sprocket 62.

Further, carrier tape 900 is fed to tape peeling unit 70 by second sprocket 62 which rotates intermittently, and cover tape 902 is peeled from carrier tape 900 by tape peeling unit 902. When engagement holes 901b which are formed on the leading end section of carrier tape 900 engage with first engaging protrusions 61a, components which are stored in carrier tape 900 are sequentially positioned in supply position 21a so as to be supplied by first sprocket 61.

While conveyance tape 910 which is carrier tape 900 being conveyed is being conveyed by the feeder 21, as illustrated in FIG. 5, conveyance tape 910 presses abutting section 31a, stopper member 31c rocks in a direction acting against the biasing force of spring 36 such that stopping section 31c approaches rail 38, thus the rear-bottom end of stopper member 31 contacts the top surface of conveyance tape 910.

The worker inserts standby tape 920, which is the carrier tape 900 that stands by, between insertion recessed section 32a and conveyance tape 910. When this is done, since the rear-bottom end of stopper member 31 contacts the top surface of conveyance tape 910, the tip of standby tape 920 abuts stopping section 31c of stopper member 31, conveyance to the downstream of standby tape 920 is prevented, and standby tape 920 stands by above conveyance tape 910.

Standby tape 920 is pushed into conveyance tape 910 by upstream side retaining member 32. Therefore, lifting of the tip of standby tape 920 from conveyance tape 910 is prevented, and the entering of the tip of standby tape 920 between the front end of upstream side retaining member 32 and the rear end of stopper member 31 is prevented.

Note that, conveyance tape 910 is wound on reel 810 which is on the front side. Standby tape 920 is wound on reel 820 which is on the rear side.

As shown in FIG. 6, when the tail end of conveyance tape 910 is conveyed closer to the downstream side than the leading end of standby tape 920, standby tape 920 assumes a state of being on rail 38, and engagement holes 901b which are formed in the leading section of standby tape 920 are engaged with fourth engaging protrusions 64a. The leading end of carrier tape 900 which is supplied by fourth sprocket 64 enters below retaining section 33d from penetrating section 33b. When engagement holes 901b which are formed in the leading section of carrier tape 900 are engaged with third engaging protrusions 63a, carrier tape 900 is conveyed to second sprocket 62 by third sprocket 63 and is conveyed to supply position 21a as described above.

When the leading end of carrier tape 900 which was standby tape 920 presses the abutting portion 31a, stopper member 31 rocks in a direction against the biasing force of spring 36, such that stopping portion 31c approaches the top surface of rail 38, and the rear-bottom end of stopper member 31 comes into contact with the new conveyance tape 910 (the old standby tape 920).

The worker removes the used reel 810 for which all of the conveyance tape 910 has been supplied from reel holding section 50 and causes the reel holding section 50 to hold the reel 820 on which new standby tape 920 is wound. The worker sets the new standby tape 920 by inserting the leading end of the new standby tape 920 between insertion recessed portion 32a and conveyance tape 910. As described above, since the rear-bottom end of stopper member 31 contacts the new conveyance tape 910, the tip of the new standby tape 920 abuts stopping portion 31c of stopper member 31, conveyance to the downstream of the standby tape 920 is prevented, and standby tape 920 stands by above conveyance tape 910.

Advantageous Effects of the Embodiment

As is apparent from the above description, as shown in FIG. 15, the configuration is such that, in a case in which engaging protrusions 62a and 63a of both second sprocket 62 (downstream sprocket) and third sprocket 63 (upstream sprocket) are respectively engaged with engaging holes 901b of carrier tape 900, carrier tape 900 slackens so as to separate from rail 38 into the space. Due to this, even in a case in which the distance between engagement hole 901b which engages with second engaging protrusion 62a and third engaging protrusion 63 is shorter than a specified distance, carrier tape 900 the engaging hole 901b of which is engaged with second engaging protrusion 62a is not pulled by third sprocket 63. Thus, components stored in carrier tape 900 are supplied accurately to supply position 21a.

Also, because carrier tape 900 is not pulled by third sprocket 63, the rotation of second sprocket 62 and third sprocket 63 is not obstructed and no load is applied to first servo motor 22 or second servo motor 23. Thus, even if a first servo motor 22 or second servo motor 23 with a large output is not used, components stored in carrier tape 900 are supplied accurately to supply position 21a.

Also, the distance between a rotation axis of second sprocket 62 and a rotation axis of third sprocket 63 (refer to FIG. 15) is set to be shorter than a specified distance which is a multiple of hole pitch P2 (refer to FIG. 2). By this, as shown in FIG. 15, in a case in which second engaging protrusion 62a and third engaging protrusion 63a are respectively engaged with engaging holes 901b of carrier tape 900, carrier tape 900 slackens so that carrier tape 900 reliably separates from rail 38 into space 38c.

Also, as shown in FIG. 15, raising prevention member 28 that prevents a leading end of carrier tape 900 from raising up from rail 38 is provided in space 38c which is formed above rail 38. By this, thanks to raising prevention member 28, the leading end of carrier tape 900 is guided onto second sprocket 62 without raising up, and thus reliably engages with second engaging protrusion 62a of second sprocket 62.

Also, control section 39 (engaging control section), when second sensor 66 (leading end detection section) has detected the leading end of carrier tape 900, controls first servo motor 22 (rotation drive section) and second servo motor 23 (rotation drive section) such that second engaging protrusion 62a engages with engaging hole 901b formed in the leading end of carrier tape 900. By this, even in a case in which the distance between a rotation axis of second sprocket and a rotation axis of third sprocket 63 is set to be shorter than a specified distance which is a multiple of hole pitch P2, second engaging protrusion 62a reliably engages with engaging hole 901b formed in the leading end of carrier tape 900. Also, because second engaging protrusion 62a engages with engaging hole 901b formed in the leading end of carrier tape 900 by control of servo motors 22 and 23, costs do not increase.

Also, control section 39, at the time that second engaging protrusion 62a engages with engaging hole 901b formed in the leading end of carrier tape 900, controls first servo motor 22 and second servo motor 23 such that the timing for starting rotation of second sprocket 62 and third sprocket 63 is not synchronized. By this, second engaging protrusion 62a reliably engages with engaging hole 901b formed in the leading end of carrier tape 900 by an easy method.

Figure 7:
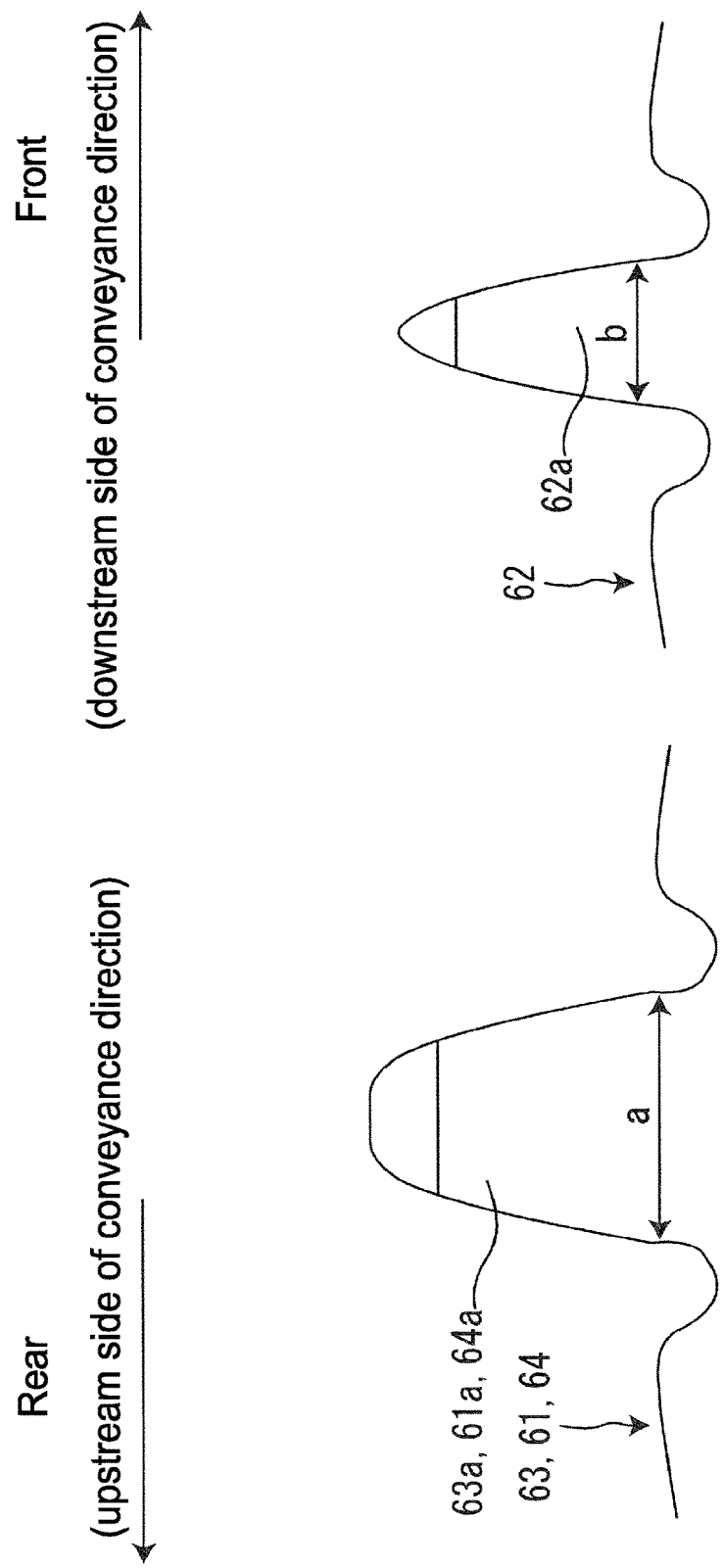
FIG. 7A is a side view of the second engaging protrusion.
FIG. 7B is a side view of the third engaging protrusion.
Figure 8:
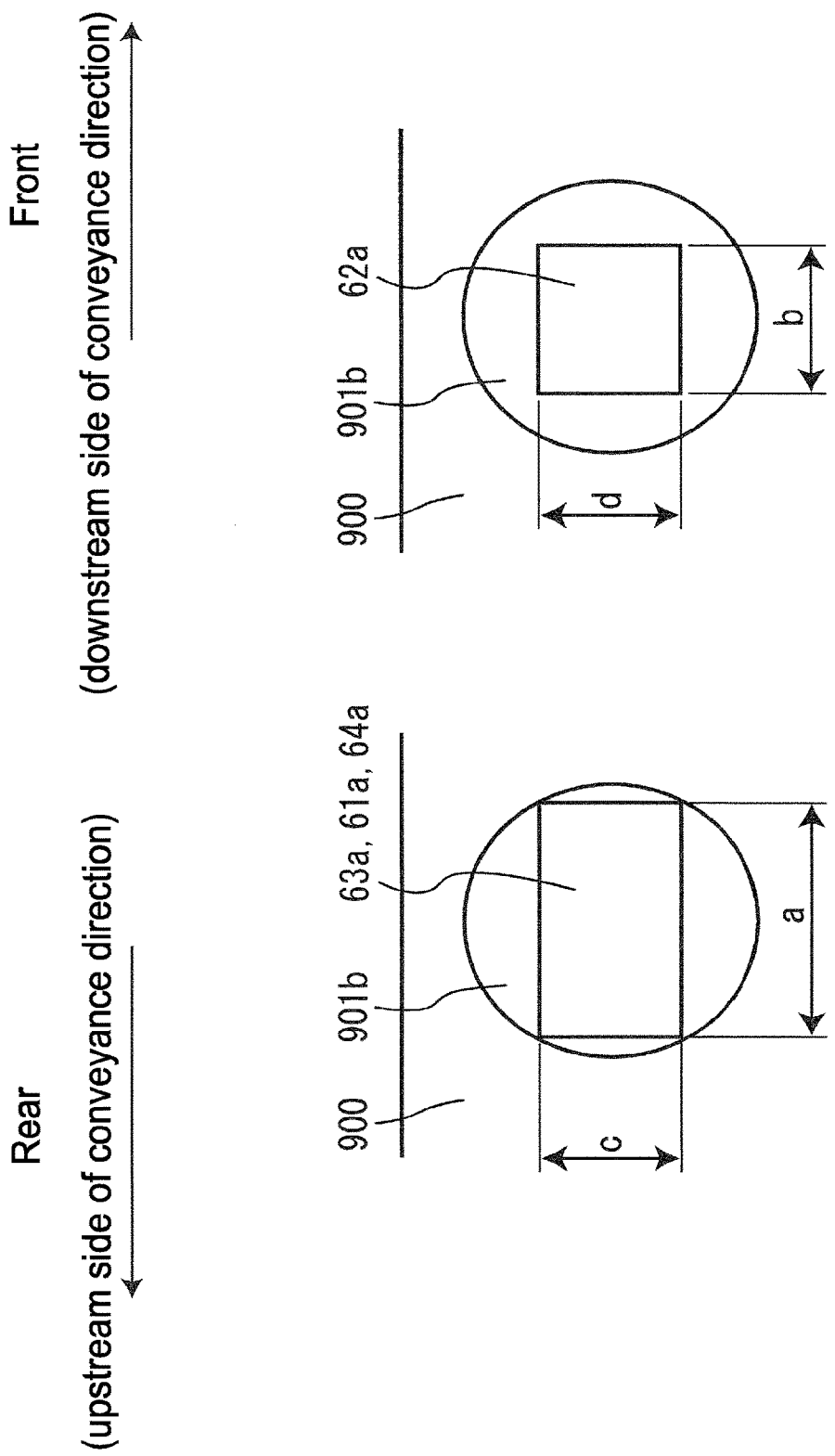
FIG. 8A is a diagram showing a state with the second engaging protrusion inserted into an engagement hole.
FIG. 8B is a diagram showing a state with the third engaging protrusion engaged with the engagement hole.

Also, as shown in FIGS. 7 and 8, tooth thickness dimension b of second engaging protrusion 62a is set to be smaller than tooth thickness dimension a of third engaging protrusion 63a. Due to this, because second engaging protrusion 62a enters easily into engaging hole 901b, the engagement of second engaging protrusion 62a with engagement hole 901b formed in the leading end of carrier tape 900 is reliable.

Another Embodiment

In the above described embodiment, by making the timing for starting the rotation of second sprocket 62 and third sprocket 63 not synchronous, second engaging protrusion 62a is engaged with engaging hole 901b formed in the leading end of carrier tape 900. However, there is no hindrance to implementing an embodiment in which control section 39 controls first servo motor 22 and second servo motor 23 such that the rotation speed of second sprocket 62 is faster than the rotation speed of third sprocket 63 such that second engaging protrusion 62a engages with engaging hole 901b formed in the leasing end of carrier tape 900.

Also, there is no hindrance to implementing an embodiment in which a tension roller which is movable in the vertical direction and biased upwards is provided above rail 38 between second sprocket 62 and third sprocket 63, such that carrier tape 900 engaged with second sprocket 62 and third sprocket 63 is forcibly slackened.

Also, the distance between a rotation axis of second sprocket 62 and a rotation axis of third sprocket 63 is set to be shorter than a specified distance which is a multiple of hole pitch P2 (refer to FIG. 2). However, there is no hindrance to implementing an embodiment in which the distance between a rotation axis of second sprocket 62 and a rotation axis of third sprocket 63 is the same as a specified distance which is a multiple of hole pitch P2 (refer to FIG. 2), and slackening carrier tape 900 by stopping first servo motor 22 thus stopping the rotation of second sprocket 62 after second engaging protrusion 62a has engaged with engaging hole 901b formed in the leading end of carrier tape 900.

REFERENCE SIGNS LIST

21: feeder; 21a: supply position; 21b: main body; 21d: insertion section; 22: first servo motor (rotation drive section); 23: second servo motor (rotation drive section); 28: raising prevention member; 38: rail; 39: control section (engaging control section); 62: second sprocket (downstream sprocket); 62a: second engaging protrusion (engaging protrusion); 63: third sprocket (upstream sprocket); 63a: third engaging protrusion (engaging protrusion); 66: second sensor (leading end detection section); 900: carrier tape; 901b: engaging hole

The invention claimed is:

1. A feeder for inserting carrier tape, in which many components are successively stored in a conveyance direction and in which engaging holes which have a prescribed relationship with the components are formed at a regular hole pitch in the conveyance direction, into an insertion section, and feeding the carrier tape such that the components are sequentially supplied to a supply position on a side opposite to the insertion section, the feeder comprising:
   a main body;
   a downstream sprocket that is rotatably provided at a position adjacent to the supply position of the main body, and has an engaging protrusion that engages with the engaging holes formed on an outer circumference section thereof;
   an upstream sprocket that is rotatably provided at a position adjacent to the insertion section of the main body, and has an engaging protrusion that engages with the engaging holes formed on an outer circumference section thereof;
   a rail, the upper surface of which forms a conveyance path of the carrier tape, that is provided above the downstream sprocket and the upstream sprocket along the conveyance direction;
   a space above the rail and between the downstream sprocket and the upstream sprocket;
   a raising prevention member provided in the space above the rail, the raising prevention member moving relative to the main body by a shaft support section of the raising prevention member that is axially supported on the main body; and
   a torsion spring attached to the main body that biases the raising prevention member toward the rail;
   wherein, in a case in which engaging protrusions of both the upstream sprocket and the downstream sprocket are respectively engaged with the engaging holes of the carrier tape, the carrier tape slackens into the space so as to separate from the rail and be guided by the raising prevention member.

2. The feeder according to claim 1, wherein the distance between a rotation axis of the downstream sprocket and a rotation axis of the upstream sprocket is set to be shorter than a specified distance which is a multiple of the hole pitch.

3. The feeder according to claim 2, wherein the feeder includes
   a rotation drive section that rotates the upstream sprocket and the downstream sprocket,
   a leading end detecting section that detects a leading end of the carrier tape upstream of the downstream sprocket, and
   an engaging control section that controls the rotation drive section such that, when the leading end detecting section detects the leading end of the carrier tape, the engaging protrusion of the downstream sprocket engages with the engaging hole formed in the leading end of the carrier tape.

4. The feeder according to claim 3, wherein the engaging control section, when engagement occurs between the engaging holes formed in the leading end of the carrier tape and the engaging protrusion of the downstream sprocket, controls the rotation drive section such that the timing to start rotation of the downstream sprocket and the timing to start rotation of the upstream sprocket are not synchronized.

5. The feeder according to claim 1, wherein the shaft support section of the raising prevention member is in the space above the rail.

6. The feeder according to claim 1, wherein, in the conveyance direction, a tooth thickness dimension of the engaging protrusion of the downstream sprocket is set to be smaller than a tooth thickness dimension of the engaging protrusion of the upstream sprocket.

* * * * *